United States Patent
Hwang et al.

(10) Patent No.: US 12,190,989 B2
(45) Date of Patent: Jan. 7, 2025

(54) DATA OUTPUT BUFFER AND SEMICONDUCTOR APPARATUS INCLUDING THE SAME

(71) Applicant: SK hynix Inc., Icheon-si (KR)

(72) Inventors: Kyu Dong Hwang, Icheon-si (KR); Bo Ram Kim, Icheon-si (KR); Dae Han Kwon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/334,261

(22) Filed: Jun. 13, 2023

(65) Prior Publication Data
US 2023/0326496 A1    Oct. 12, 2023

Related U.S. Application Data

(62) Division of application No. 17/361,018, filed on Jun. 28, 2021, now Pat. No. 11,699,467.

(30) Foreign Application Priority Data

Mar. 23, 2021 (KR) .................. 10-2021-0037586

(51) Int. Cl.
*G11C 7/00* (2006.01)
*G11C 7/10* (2006.01)
*H03K 19/00* (2006.01)
*H03K 19/017* (2006.01)

(52) U.S. Cl.
CPC .......... *G11C 7/1039* (2013.01); *G11C 7/1057* (2013.01); *G11C 7/1096* (2013.01); *H03K 19/0005* (2013.01); *H03K 19/01742* (2013.01)

(58) Field of Classification Search
CPC .................................................. G11C 7/1039
USPC ...................................................... 365/189.05
See application file for complete search history.

(56) References Cited

U.S. PATENT DOCUMENTS

| | | | |
|---|---|---|---|
| 7,573,288 B2 | 8/2009 | Ayyapureddi et al. | |
| 9,998,121 B2 | 6/2018 | Choi | |
| 2013/0076395 A1 | 3/2013 | Kim | |
| 2018/0123593 A1* | 5/2018 | Choi | H03K 19/018571 |

\* cited by examiner

*Primary Examiner* — Hoai V Ho
(74) *Attorney, Agent, or Firm* — WILLIAM PARK & ASSOCIATES LTD.

(57) ABSTRACT

A data output buffer includes a first driver configured to drive a data input/output (I/O) pad according to an input signal and allow data drivability to be controlled according to an impedance calibration code and a second driver configured to perform a de-emphasis operation on the data I/O pad and allow de-emphasis drivability to be controlled according to the impedance calibration code.

12 Claims, 6 Drawing Sheets

DATA OUTPUT BUFFER AND SEMICONDUCTOR APPARATUS INCLUDING THE SAME

CROSS-REFERENCES TO RELATED APPLICATION

The present application is a divisional application of U.S. patent application Ser. No. 17/361,018, filed on Jun. 28, 2021, and claims priority under 35 U.S.C. § 119(a) to Korean application number 10-2021-0037586, filed on Mar. 23, 2021, in the Korean Intellectual Property Office, which is incorporated herein by reference in its entirety.

BACKGROUND

1. Technical Field

Various embodiments may generally relate to a semiconductor circuit, and more particularly, to a data output buffer and a semiconductor apparatus including the same.

2. Related Art

Semiconductor apparatuses may data communicate with external devices through a plurality of data lines.

The semiconductor apparatus includes data buffers configured to output and input data to and from the external devices.

Variation of drivability in the data buffers may occur due to change in operation environment such as power, voltage, and temperature (PVT) variations, and various problems such as deterioration in signal quality due to inter symbol interference may be caused when the variation of drivability in the data buffers occurs.

SUMMARY

In an embodiment of the present disclosure, a data output buffer may include: a first driver configured to drive a data input/output (I/O) pad according to an input signal and allow data drivability to be controlled according to an impedance calibration code; and a second driver configured to perform a de-emphasis operation on the data I/O pad and allow de-emphasis drivability to be controlled according to the impedance calibration code.

In an embodiment of the present disclosure, a data output buffer may include: a first driver configured to drive a data input/output (I/O) pad according to an input signal and allow data drivability to be controlled according to an impedance calibration code; a second driver configured to perform a de-emphasis operation on the data I/O pad and allow de-emphasis drivability to be controlled according to a selection code; and a selection circuit configured to output one of a fixing code and the impedance calibration code as the selection code according to a selection signal.

In an embodiment of the present disclosure, a semiconductor apparatus may include: a memory region configured to output read data through a data input/output (I/O) pad according to a read command and configured to store write data that is input through the data I/O pad according to a write command; an impedance calibration circuit configured to adjust a value of an impedance calibration code based on an impedance of an external resistor; and a data output buffer configured to drive the data I/O pad according to an input signal, allow data drivability to be controlled according to the impedance calibration code, perform an de-emphasis operation on the data I/O pad, and allow de-emphasis drivability to be controlled according to a selection code.

These and other features, aspects, and embodiments are described in more detail below.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

Embodiments are provided to a data output buffer capable of maintaining stable drivability in response to change in external environments and a semiconductor apparatus including the same.

Figure 1:
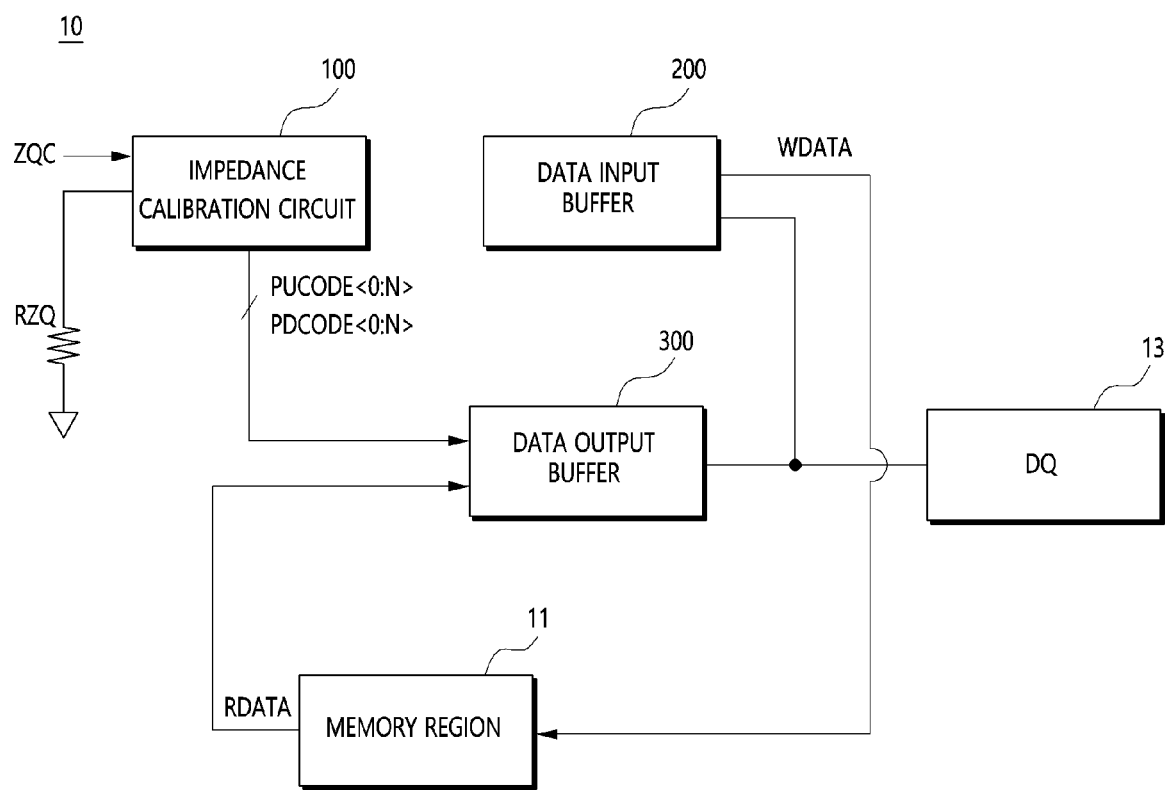
FIG. 1 is a diagram illustrating a configuration of a semiconductor apparatus according to an embodiment of the present disclosure.

FIG. 1 is a diagram illustrating a configuration of a semiconductor apparatus 10 according to an embodiment of the present disclosure.

Referring to FIG. 1, the semiconductor apparatus 10 may include a memory region 11, a data input/output (I/O) pad (DQ) 13, an impedance calibration circuit 100, a data input buffer 200, and a data output buffer 300.

The memory region 11 may output read data RDATA according to a read command and may store input write data WDATA according to a write command.

Data that is input and output between the semiconductor apparatus 10 and an external system of the semiconductor apparatus (for example, a memory controller) may be accomplished through the data I/O pad DQ.

The impedance calibration circuit 100 may perform an impedance calibration operation that adjusts at least one value of first and second impedance calibration codes PUCODE<0:N> and PDCODE<0:N> according to an impedance calibration command ZQC so that an output impedance of the semiconductor apparatus 10 coincides with the impedance of the external resistor RZQ.

The data input buffer 200 may generate the write data WDATA by receiving data that is input through the data I/O pad DQ during a write operation section of the semiconductor apparatus 10.

The data output buffer 300 may drive the data I/O pad DQ according to an input signal, for example, read data RDATA, and may allow the data drivability to be controlled, according to the first and second impedance calibration codes PUCODE<0:N> and PDCODE<0:N>, to have a constant value regardless of PVT variations.

The data output buffer 300 may perform an emphasis operation on the data I/O pad DQ and may allow the emphasis drivability to be controlled, according to at least one of the first and second impedance calibration codes PUCODE<0:N> and PDCODE<0:N>, to have a constant value regardless of the PVT variations.

Figure 2:
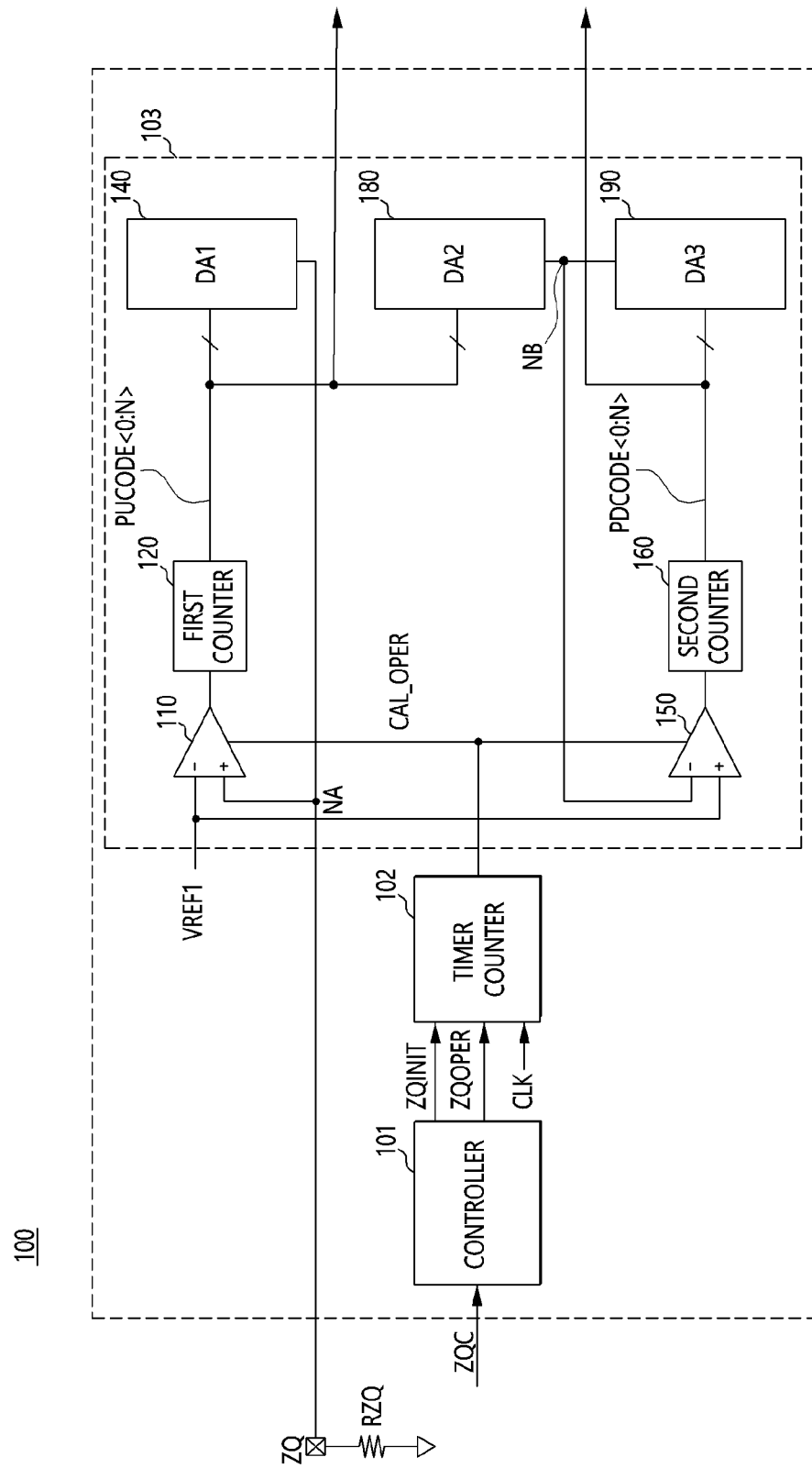
FIG. 2 is a diagram illustrating a configuration of an impedance calibration circuit of FIG. 1.

FIG. 2 is a diagram illustrating a configuration of the impedance calibration circuit 100 of FIG. 1.

Referring to FIG. 2, the impedance calibration circuit 100 may include a controller 101, a timer counter 102, and an impedance calibration code generator 103.

The controller 101 may generate a plurality of internal commands ZQINIT and ZQOPER that define the performing of the impedance calibration operation in response to the impedance calibration command ZQC.

According to operation standards of semiconductor memories that are related to impedance calibration, the impedance calibration command ZQC may be generated based on a combination of control signals such as, as a chip enable signal/CS (not shown), a row address strobe signal/RAS (not shown), a column address strobe signal/CAS (not shown), and a write enable signal/WE (not shown).

The time counter 102 may generate an operation control signal CAL_OPER that sets the impedance calibration operation times that correspond to the plurality of internal commands ZQINIT and ZQOPER by using a clock signal CLK.

The impedance calibration code generator 103 may operate during a time that is determined by the operation control signal CAL_OPER to generate the first and second impedance calibration codes PUCODE<0:N> and PDCODE<0:N>.

The impedance calibration code generator 103 may include a first comparator 110, a first counter 120, a first digital-analog converter (DAC) (DA1) 140, a second comparator 150, a second counter 160, a second DAC (DA2) 180, and a third DAC (DA3) 190.

Based on the impedance calibration command ZQC, the first comparator 110 may compare a first reference voltage VREF1 to a voltage of a first node NA and may output a comparison result during an activation section of the operation control signal CAL_OPER. The first node NA may be coupled to an external resistor pad ZQ.

The first counter 120 may adjust the value of the first impedance calibration code PUCODE<0:N> by performing up/down counting according to an output of the first comparator 110.

The first DAC 140 may convert the digital code-type first impedance calibration code PUCODE<0:N> to an analog voltage level and may apply the analog voltage level to the first node NA.

The first DAC 140 may include a circuit configuration in which a pull-up driving circuit (see FIG. 4) of a data output buffer 300-2 is duplicated.

The first DAC 140 may be coupled to the external resistor RZQ through the external resistor pad ZQ.

Based on the impedance calibration command ZQC, the second comparator 150 may compare the first reference voltage VREF1 to a voltage of a second node NB and may output a comparison result during the activation section of the operation control signal CAL_OPER.

The second counter 160 may adjust the value of the second impedance calibration code PDCODE<0:N> by performing up/down counting according to an output of the second comparator 150.

The second DAC 180 may convert the digital code-type first impedance calibration code PUCODE<0:N> to an analog voltage level and may apply the analog voltage level to the second node NB.

The second DAC 180 may include a circuit configuration in which a pull-down driving circuit (see FIG. 5) of a data output buffer 300-3 is duplicated.

The third DAC 190 may convert the digital code-type second impedance calibration code PDCODE<0:N> to an analog voltage level and apply the analog voltage level to the second node NB.

The third DAC 190 may include a circuit configuration in which the pull-down driving circuit (see FIG. 5) of the data output buffer 300-3 is duplicated.

Figure 3:
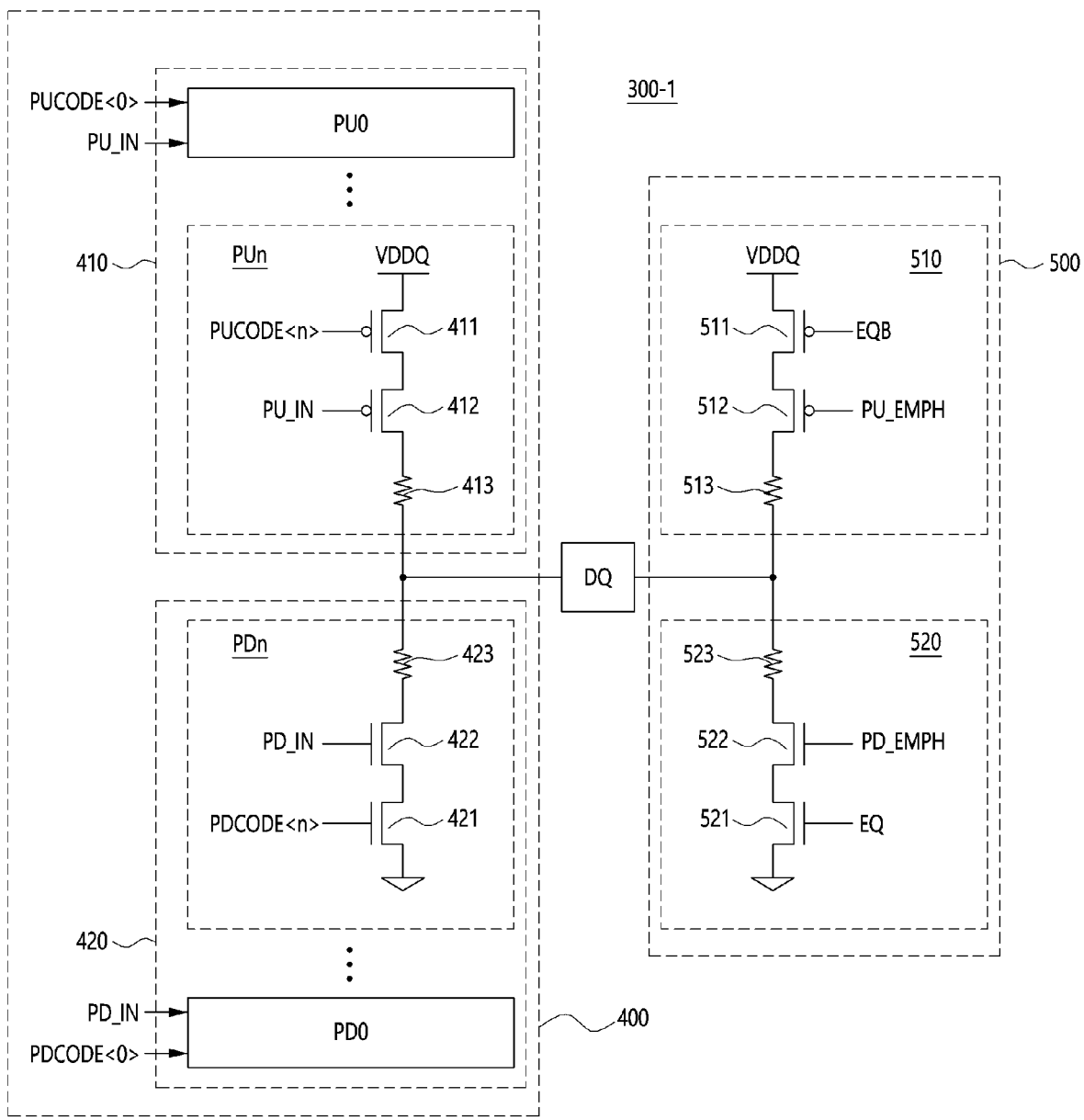
FIG. 3 is a diagram illustrating a configuration of a data output buffer according to an embodiment of the present disclosure.

FIG. 3 is a diagram illustrating a configuration of a data output buffer 300-1 according to an embodiment.

Referring to FIG. 3, the data output buffer 300-1 may include a first driver 400 and a second driver 500.

The first driver 400 may drive the data I/O pad DQ according to a first data signal PU_IN, a second data signal PD_IN, the first impedance calibration code PUCODE<0:n>, and the second impedance calibration code PDCODE<0:n>.

The first driver 400 may drive the data I/O pad DQ according to the input signal, for example, the first data signal PU_IN and the second data signal PD_IN, and may allow the data drivability to have a constant value regardless of the PVT variations according to the first and second impedance calibration codes PUCODE<0:n> and PDCODE<0:n>.

The first driver 400 may include a pull-up driver 410 and a pull-down driver 420.

The pull-up driver 410 may include a plurality of pull-up driving circuits PU0 to PUn.

The plurality of pull-up driving circuits PU0 to PUn may commonly receive the first data signal PU_IN.

The plurality of pull-up driving circuits PU0 to PUn may receive code bits of the first impedance calibration code PUCODE<0:N>, in order, bit by bit.

Each of the plurality of pull-up driving circuits PU0 to PUn may have the same configuration as each other.

In an embodiment, the pull-up driving circuit PUn may include a first transistor 411, a second transistor 412, and a resistor 413.

A source terminal of the first transistor 411 may be coupled to a power terminal VDDQ, and a gate terminal thereof may receive a code bit, for example, PUCODE<6> of the first impedance calibration code PUCODE<0:N>.

A source terminal of the second transistor 412 may be coupled to a drain terminal of the first transistor 411, and a gate terminal thereof may receive the first data signal PU_IN.

One terminal of the resistor 413 may be coupled to a drain terminal of the second transistor 412, and the other terminal thereof may be coupled to the data I/O pad DQ.

The pull-down driver 420 may include a plurality of pull-down driving circuits PD0-PDn.

The plurality of pull-down driving circuits PD0 to PDn may commonly receive the second data signal PD_IN.

The plurality of pull-down driving circuits PD0 to PDn may receive code bits of the second impedance calibration code PDCODE<0:N>, in order, bit by bit.

Each of the plurality of pull-down driving circuits PD0 to PDn may have the same configuration as each other.

In an embodiment, the pull-down driving circuit PDn may include a first transistor 421, a second transistor 422, and a resistor 423.

A source terminal of the first transistor 421 may be coupled to a ground terminal, and a gate terminal thereof may receive a code bit, for example, PDCODE<6> of the second impedance calibration code PDCODE<0:N>.

A source terminal of the second transistor 422 may be coupled to a drain terminal of the first transistor 421, and a gate terminal thereof may receive the second data signal PD_IN.

One terminal of the resistor 423 may be coupled to a drain terminal of the second transistor 422, and the other terminal thereof may be coupled to the data I/O pad DQ.

The second driver 500 may perform an emphasis operation, for example, a de-emphasis operation, on an output terminal, for example, the data I/O pad DQ, according to an emphasis signal PU_EMPH/PD_EMPH and a control signal EQB/EQ.

The control signal EQB/EQ may include a first control signal EQB and a second control signal EQ. The first control signal EQB and the second control signal EQ may be complementary signals and may have opposite logic levels to each other.

The second driver 500 may include a pull-up driving circuit (EQPU) 510 and a pull-down driving circuit (EQPD) 520.

The pull-up driving circuit 510 may perform a de-emphasis operation on the data I/O pad DQ according to an emphasis signal, for example, the first emphasis signal PU_EMPH, and a control signal, for example, the first control signal EQB.

The pull-up driving circuit 510 may include a first transistor 511, a second transistor 512, and a resistor 513.

A source terminal of the first transistor 511 may be coupled to the power terminal VDDQ, and a gate terminal thereof may receive the first control signal EQB.

A source terminal of the second transistor 512 may be coupled to a drain terminal of the first transistor 511, and a gate terminal thereof may receive the first emphasis signal PU_EMPH.

One terminal of the resistor 513 may be coupled to a drain terminal of the second transistor 512, and the other terminal thereof may be coupled to the data I/O pad DQ.

The pull-down driving circuit 520 may perform a de-emphasis operation on the data I/O pad DQ according to an emphasis signal, for example, the second emphasis signal PD_EMPH, and a control signal, for example, the second control signal EQ.

The pull-down driving circuit 520 may include a first transistor 521, a second transistor 522, and a resistor 523.

A source terminal of the first transistor 521 may be coupled to the ground terminal, and a gate terminal thereof may receive the second control signal EQ.

A source terminal of the second transistor 522 may be coupled to a drain terminal of the first transistor 521, and a gate terminal thereof may receive the second emphasis signal PD_EMPH.

One terminal of the resistor 523 may be coupled to a drain terminal of the second transistor 522, and the other terminal thereof may be coupled to the data I/O pad DQ.

The data output buffer 300-1, according to an embodiment, may further include a pre-driver (not shown) that is configured to generate the first data signal PU_IN and the second data signal PD_IN according to the read data RDATA.

The emphasis signal PU_EMPH/PD_EMPH may be used as a signal for controlling the de-emphasis operation based on a level of a data that is driven by the first driver 400.

The levels of the first and second emphasis signals PU_EMPH and PD_EMPH may have a complementary relationship with the first data signal PU_IN and the second data signal PD_IN, respectively.

The first emphasis signal PU_EMPH of the emphasis signal PU_EMPH/PD_EMPH may have the opposite level of the first data signal PU_IN, and the second emphasis signal PD_EMPH may have the opposite level of the second data signal PD_IN.

The control signal EQB/EQ may be used as a signal for turning on/off the de-emphasis function of the second driver 500.

The de-emphasis function of the second driver 500 may be activated by generating first and second control signals EQB and EQ with low and high levels, respectively, and may be deactivated by generating the first and second control signals EQB and EQ with high and low levels, respectively.

The de-emphasis function may be a function to lower and raise the DC level of a signal. For example, the de-emphasis function may be an operation that lowers a high level signal by a determined amount within a recognizable range as a high level and raises a low level signal by a determined amount within a recognizable range as a low level.

Accordingly, the transistors that constitute the second driver 500 may be designed to have a relatively small size compared to the transistors that constitute the first driver 400 to be suitable for the performing of the de-emphasis function. For example, when the gate width of the transistor 412 that constitutes the first driver 400 is '1', the gate width of the transistor 522 that constitutes the second driver 500 may be designed to be '1/J'. 'J' may be a natural number.

Hereinafter, an operation of the data output buffer 300-1, according to an embodiment, will be described below.

The first driver 400 may drive the data I/O pad DQ as an impedance that is determined according to the first impedance calibration code PUCODE<0:n> and the second impedance calibration code PDCODE<0:n>.

For example, when the first data signal PU_IN and the second data signal PD_IN have a low level, the levels of the first and second emphasis signals PU_EMPH and PD_EMPH may have the complementary relationship with the first data signal PU_IN and the second data signal PD_IN, and thus, may have a high level.

Pull-up driving circuits, among the plurality of pull-up driving circuits PU0 to Pun, which receive the code bits of the first impedance calibration code PUCODE<0:N> with a low level, may operate, and the first driver 400 may drive the data I/O pad DQ to a high level.

Since the first and second emphasis signals PU_EMPH and PD_EMPH have a high level, the pull-down driving circuit 520 of the second driver 500 may operate, and the second driver 500 may perform a de-emphasis operation by lowering the voltage level of the data I/O pad DQ that is driven to a high level through the first driver 400 by a determined level.

In another example, when the first data signal PU_IN and the second data signal PD_IN have a high level, the levels of the first and second emphasis signals PU_EMPH and PD_EMPH may have the complementary relationship with the first data signal PU_IN and the second data signal PD_IN, and thus, may have a low level.

Pull-down driving circuits, among the plurality of pull-down driving circuits PD0 to PDn, which receive the code bits of the second impedance calibration code PDCODE<0:N> with a high level, may operate, and the first driver 400 may drive the data I/O pad DQ to a low level.

Since the first and second emphasis signals PU_EMPH and PD_EMPH have a low level, the pull-up driving circuit 510 of the second driver 500 may operate, and the second driver 500 may perform a de-emphasis operation by raising the voltage level of the data I/O pad DQ that is driven to a low level through the first driver 400 by a determined level.

Figure 4:
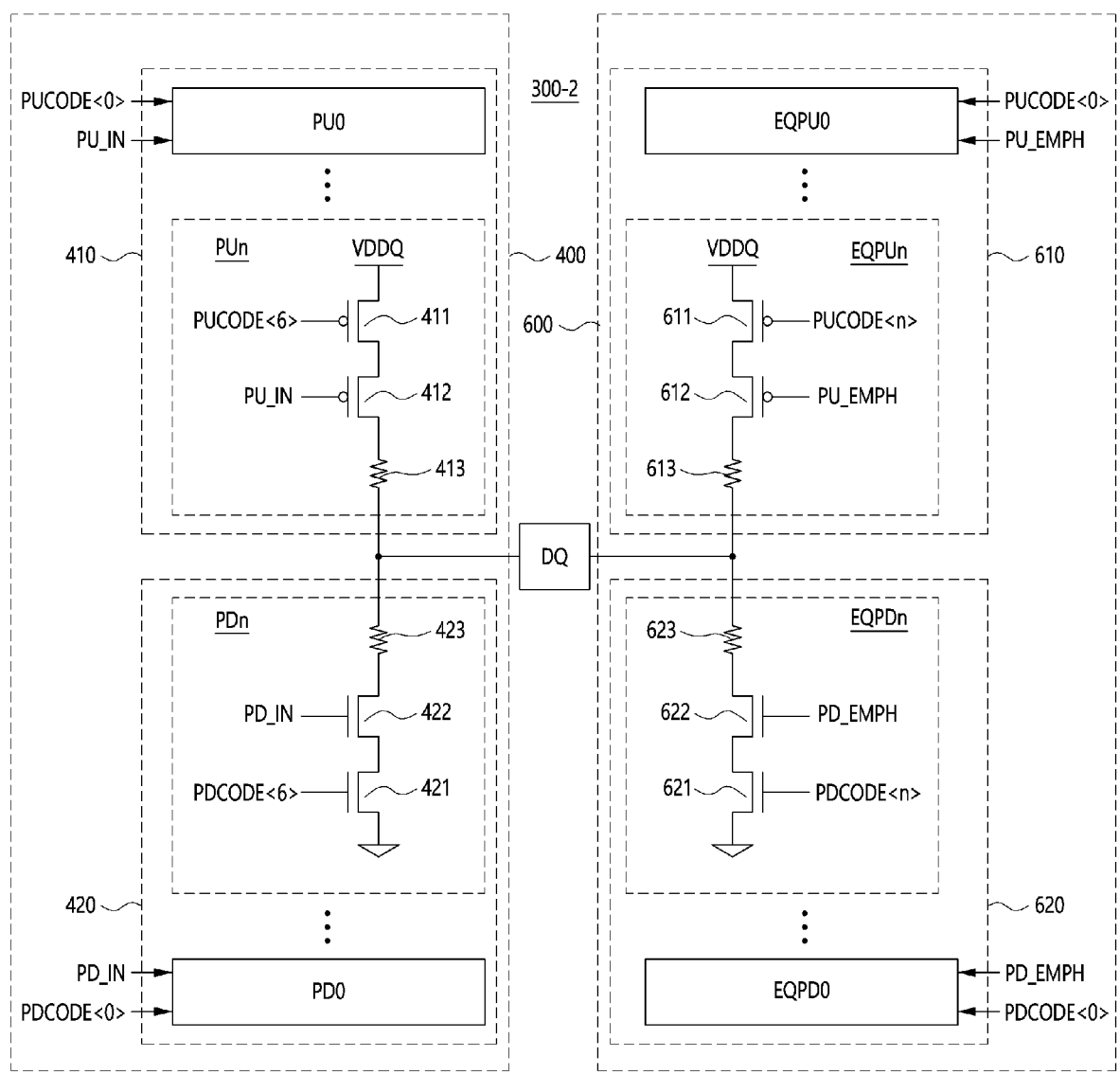
FIGS. 4 to 6 are diagrams illustrating configurations of data output buffers according to other embodiments of the present disclosure.

FIG. 4 is a diagram illustrating a configuration of the data output buffer 300-2 according to another embodiment.

The data output buffer 300-2 may allow the data drivability for the data I/O pad DQ to be controlled according to the first and second impedance calibration codes PUCODE<0:n> and PDCODE<0:n> and may allow the de-emphasis drivability for the data I/O pad DQ to be controlled according to all code bits of the first and second impedance calibration codes PUCODE<0: n> and PDCODE<0:n>.

Referring to FIG. 4, the data output buffer 300-2 may include a first driver 400 and a second driver 600.

The first driver 400 may drive the data I/O pad DQ according to the first data signal PU_IN, the second data signal PD_IN, the first impedance calibration code PUCODE<0:n>, and the second impedance calibration code PDCODE<0:n>.

The first driver 400 may drive the data I/O pad DQ according to the input signal, for example, the first data signal PU_IN and the second data signal PD_IN, and may allow the data drivability to be controlled, according to the first impedance calibration code PUCODE<0:n> and the second impedance calibration code PDCODE<0:n>, to have a constant value regardless of the PVT variations.

The first driver 400 may have the same configuration as the first driver 400 of FIG. 3.

The second driver 600 may perform a de-emphasis operation on an output terminal, for example, the data I/O pad DQ according to the emphasis signal PU_EMPH/PD_EMPH, the first impedance calibration code PUCODE<0: n>, and the second impedance calibration code PDCODE<0:n>.

The second driver 600 may perform the de-emphasis operation on the data I/O pad DQ and may allow the de-emphasis drivability to be controlled, according to the first impedance calibration code PUCODE<0:n> and the second impedance calibration code PDCODE<0:n>, to have a constant value regardless of the PVT variations.

The second driver 600 may include a pull-up driver 610 and a pull-down driver 620.

The pull-up driver 610 may include a plurality of pull-up driving circuits EQPU0 to EQPUn.

The plurality of pull-up driving circuits EQPU0 to EQPUn may perform the de-emphasis operation on the data I/O pad DQ according to an emphasis signal, for example, the first emphasis signal PU_EMPH, and the first impedance calibration code PUCODE<0:n>.

The plurality of pull-up driving circuits EQPU0 to EQPUn may commonly receive the first emphasis signal PU_EMPH.

The plurality of pull-up driving circuits EQPU0 to EQPUn may receive code bits of the first impedance calibration code PUCODE<0:n>, in order, bit by bit.

The plurality of pull-up driving circuits EQPU0 to EQPUn may have the same configuration as each other.

For example, the pull-up driving circuit EQPUn may include a first transistor 611, a second transistor 612, and a resistor 613.

A source terminal of the first transistor 611 may be coupled to a power terminal VDDQ, and a gate terminal thereof may receive a code bit PUCODE<n> of the first impedance calibration code PUCODE<0:n>.

A source terminal of the second transistor 612 may be coupled to a drain terminal of the first transistor 611, and a gate terminal thereof may receive the first emphasis signal PU_EMPH.

One terminal of the resistor 613 may be coupled to a drain terminal of the second transistor 612, and the other terminal thereof may be coupled to the data I/O pad DQ.

The pull-down driver 620 may include a plurality of pull-down driving circuits EQPD0-EQPDn.

The plurality of pull-down driving circuits EQPD0 to EQPDn may perform a de-emphasis operation on the data I/O pad DQ according to the other emphasis signal, for example, the second emphasis signal PD_EMPH, and the second impedance calibration code PDCODE<0: n>.

The plurality of pull-down driving circuits EQPD0 to EQPDn may commonly receive the second emphasis signal PD_EMPH.

The plurality of pull-down driving circuits EQPD0 to EQPDn may receive code bits of the second impedance calibration code PDCODE<0:n> in order, bit by bit.

The plurality of pull-down driving circuits EQPD0 to EQPDn may have the same configuration as each other.

For example, the pull-down driving circuit EQPDn may include a first transistor 621, a second transistor 622, and a resistor 623.

A source terminal of the first transistor 621 may be coupled to a ground terminal, and a gate terminal thereof may receive a code bit PDCODE<n> of the second impedance calibration code PDCODE<0:n>.

A source terminal of the second transistor 622 may be coupled to a drain terminal of the first transistor 621, and a gate terminal thereof may receive the second emphasis signal PD_EMPH.

One terminal of the resistor 623 may be coupled to a drain terminal of the second transistor 622, and the other terminal thereof may be coupled to the data I/O pad DQ.

The first and second emphasis signals PU_EMPH and PD_EMPH may be used for controlling the de-emphasis operation based on the data level that is driven by the first driver 400.

The levels of the first and second emphasis signals PU_EMPH and PD_EMPH may have a complementary relationship with the first data signal PU_IN and the second data signal PD_IN, respectively.

The first emphasis signal PU_EMPH of the emphasis signal PU_EMPH/PD_EMPH may have the opposite level of the first data signal PU_IN and the second emphasis signal PD_EMPH may have the opposite level of the second data signal PD_IN.

The de-emphasis drivability of the second driver 600 may be controlled, according to the first impedance calibration code PUCODE<0:n> and the second impedance calibration code PDCODE<0:n>, to have a constant value regardless of the PVT variations.

The transistors that constitute the second driver 600 may be designed to have a relatively small size compared to the transistors that constitute the first driver 400 to be suitable for the performing of the de-emphasis function. For example, when a gate width of the transistor 412 that constitutes the first driver 400 is '1', a gate width of the transistor 622 that constitutes the second driver 600 may be designed to be '1/K'. 'K' may be a natural number.

The data output buffer 300-2, according to another embodiment, may further include a pre-driver (not shown) that is configured to generate the first data signal PU_IN and the second data signal PD_IN according to the read data RDATA.

Hereinafter, an operation of the data output buffer 300-2 will be described below.

For example, it is assumed that the first data signal PU_IN and the second data signal PD_IN have a low level, the first impedance calibration code PUCODE<0:n> is '1110101', and the second impedance calibration code PDCODE<0:n> is '0001110'. Here, the code bit '0' may be the low level and the code bit '1' may be the high level.

Since the first data signal PU_IN and the second data signal PD_IN have the low level, the levels of the first and second emphasis signals PU_EMPH and PD_EMPH may have a complementary relationship with the first data signal PU_IN and the second data signal PD_IN, and thus, may have a high level.

Since the first data signal PU_IN and the second data signal PD_IN have the low level, pull-up driving circuits PU3 and PU5, among the plurality of pull-up driving circuits PU0 to Pun, which receive the code bits of the first impedance calibration code PUCODE<0:n> with the low level, may operate, and the first driver 400 may drive the data I/O pad DQ to the high level.

Since the first and second emphasis signals PU_EMPH and PD_EMPH have the high level, pull-down driving circuits EQPD3, EQPD4, and EQPD5, among the plurality of pull-down driving circuits EQPD0 to EQPDn of the second driver 600, which receive the code bits of the second impedance calibration code PDCODE<0:n> with the high level, may operate, and the second driver 600 may perform the de-emphasis operation that lowers the voltage level of the data I/O pad DQ by a determined level.

In another example, it is assumed that the first data signal PU_IN and the second data signal PD_IN have the high level, the first impedance calibration code PUCODE<0:n> is '1110101', and the second impedance calibration code PDCODE<0:n> is '0001110'.

Since the first data signal PU_IN and the second data signal PD_IN have the high level, the levels of the first and second emphasis signals PU_EMPH and PD_EMPH may have a complementary relationship with the first data signal PU_IN and the second data signal PD_IN, and thus, may have the low level.

Since the first data signal PU_IN and the second data signal PD_IN have the high level, pull-down driving circuits PD3, PD4, and PU5, among the plurality of pull-down driving circuits PD0 to PDn, which receive the code bits of the second impedance calibration code PDCODE<0:n> with the high level, may operate, and the first driver 400 may drive the data I/O pad DQ to the low level.

Since the first and second emphasis signals PU_EMPH and PD_EMPH have the low level, pull-up driving circuits EQPU3 and EQPU5, among the plurality of pull-up driving circuits EQPU0 to EQPUn of the second driver 600, which receive the code bits of the first impedance calibration code PUCODE<0:n> with the low level may operate, and the second driver 600 may perform the de-emphasis operation that raises the voltage level of the data I/O pad DQ by a determined level.

Figure 5:
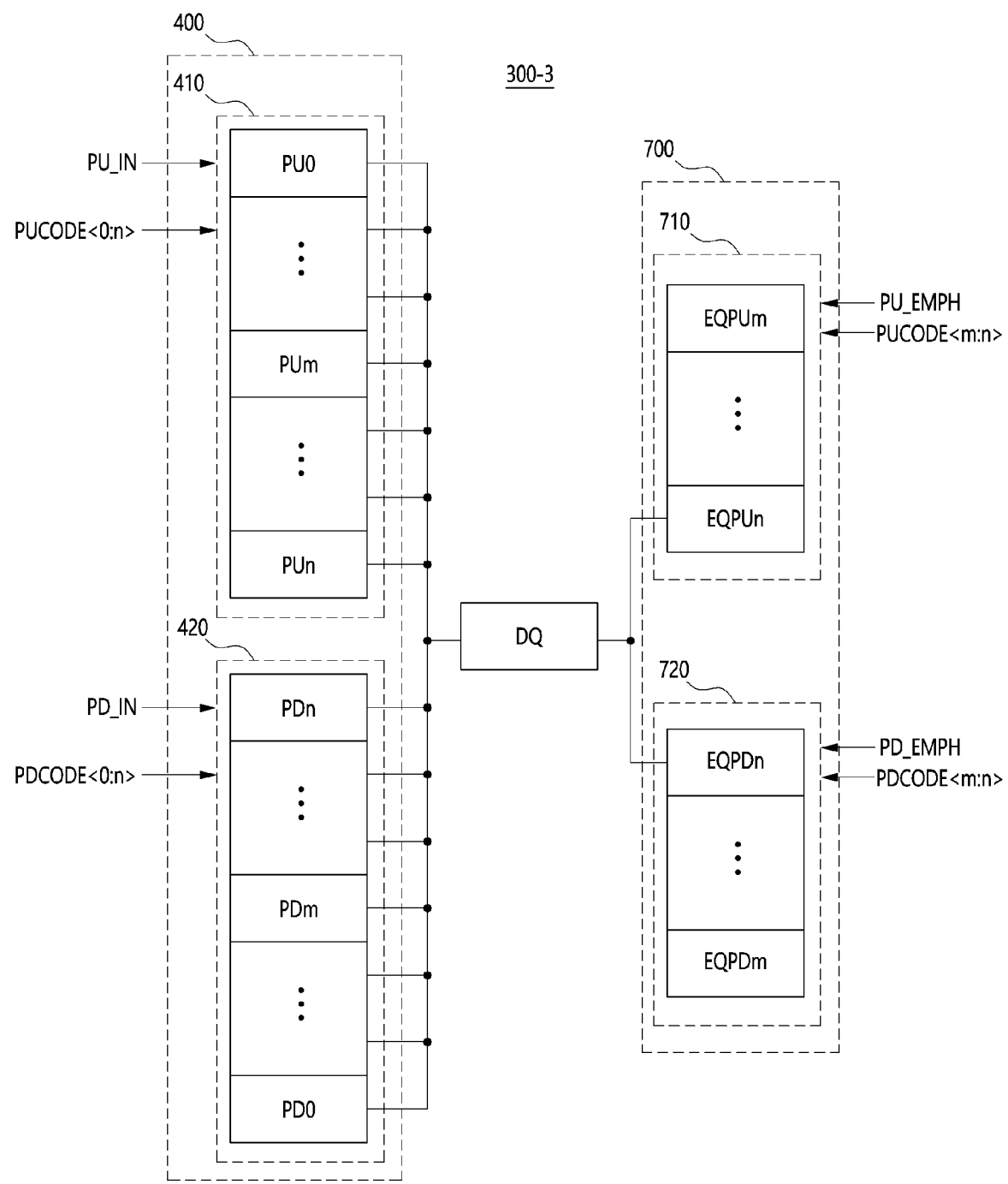

FIG. 5 is a diagram illustrating a configuration of the data output buffer 300-3 according to another embodiment.

The data output buffer 300-3 may allow the data drivability for the data I/O pad DQ to be controlled according to the first and second impedance calibration codes PUCODE<0:N> and PDCODE<0:N> and may allow the de-emphasis drivability for the data I/O pad DQ to be controlled according to at least one among all code bits of the first impedance calibration code PUCODE<0:n> and at least one among all code bits of the second impedance calibration code PDCODE<0:n>.

Referring to FIG. 5, the data output buffer 300-3 according to another embodiment may include a first driver 400 and a second driver 700.

The first driver 400 may drive the data I/O pad DQ according to the first data signal PU_IN, the second data signal PD_IN, the first impedance calibration code PUCODE<0:n>, and the second impedance calibration code PDCODE<0:n>.

The first driver 400 may drive the data I/O pad DQ according to the input signal, for example, the first data signal PU_IN and the second data signal PD_IN, and the data drivability may be controlled according to the first impedance calibration code PUCODE<0: n> and the second impedance calibration code PDCODE<0:n>.

The first driver 400 may have the same configuration as the first driver 400 of FIG. 3.

The second driver 700 may perform the de-emphasis operation on an output terminal, for example, the data I/O pad DQ, according to the emphasis signal PU_EMPH/PD_EMPH, at least one among all the code bits of the first impedance calibration code PUCODE<0:n>, and at least one among all the code bits of the second impedance calibration codes PDCODE<0: n>.

As the at least one code bit of the first impedance calibration code PUCODE<0:n>, upper code bits, for example, the first impedance calibration code PUCODE<m:n>, may be used.

As the at least one code bit of the second impedance calibration code PDCODE<0:n>, upper code bits, for example, the second impedance calibration code PDCODE<m:n>, may be used.

The second driver 700 may perform the de-emphasis operation on the data I/O pad DQ and the de-emphasis drivability may be controlled according to the first impedance calibration code PUCODE<m:n> and the second impedance calibration code PDCODE<m:n>.

The second driver 700 may include a pull-up driver 710 and a pull-down driver 720.

The pull-up driver 710 may include a plurality of pull-up driving circuits EQPUm to EQPUn that correspond to the code bits of the first impedance calibration code PUCODE<m:n>.

The plurality of pull-up driving circuits EQPUm to EQPUn may perform the de-emphasis operation on the data I/O pad DQ according to an emphasis signal, for example, the first emphasis signal PU_EMPH, and the first impedance calibration code PUCODE<m:n>.

The plurality of pull-up driving circuits EQPUm to EQPUn may commonly receive the first emphasis signal PU_EMPH.

The plurality of pull-up driving circuits EQPUm to EQPUn may receive the code bits of the first impedance calibration code PUCODE<m:n> in order, bit by bit.

The plurality of pull-up driving circuits EQPUm to EQPUn may have the same configuration as each other. For example, the pull-up driving circuit EQPUn may have the same configuration as the pull-up driving circuit EQPUn of FIG. 4.

The pull-down driver 720 may include a plurality of pull-down driving circuits EQPDm to EQPDn that correspond to the code bits of the second impedance calibration code PDCODE<m:n>.

The plurality of pull-down driving circuits EQPDm to EQPDn may perform the de-emphasis operation on the data I/O pad DQ according to the other emphasis signal, for example, the second emphasis signal PD_EMPH, and the second impedance calibration code PDCODE<m:n>.

The plurality of pull-down driving circuits EQPDm to EQPDn may commonly receive the second emphasis signal PD_EMPH.

The plurality of pull-down driving circuits EQPDm to EQPDn may receive the code bits of the second impedance calibration code PDCODE<m:n>, in order, bit by bit.

The plurality of pull-down driving circuits EQPDm to EQPDn may have the same configuration as each other. For example, the pull-down driving circuit EQPDn may have the same configuration as the pull-down driving circuit EQPDn of FIG. 4.

The transistors that constitute the second driver 700 may be designed to have a relatively small size compared to the transistors that constitute the first driver 400 to be suitable for the performing of the de-emphasis function. For example, when a gate width of the transistor 412 that constitutes the first driver 400 is '1', a gate width of the transistor 622 that constitutes the second driver 600 may be designed to be '1/L'. 'L' can be a natural number.

The data output buffer 300-3, according to another embodiment, may further include a pre-driver (not shown) that is configured to generate the first data signal PU_IN and the second data signal PD_IN according to the read data RDATA.

Although the number of pull-up driving circuits and the number of pull-down driving circuits that constitute the second driver 700 in the data output buffer 300-3 are different from those in the data output buffer 300-2 of FIG. 4, the operation of the data output buffer 300-3 may be performed in the same manner as the data output buffer 300-2 of FIG. 4.

Figure 6:
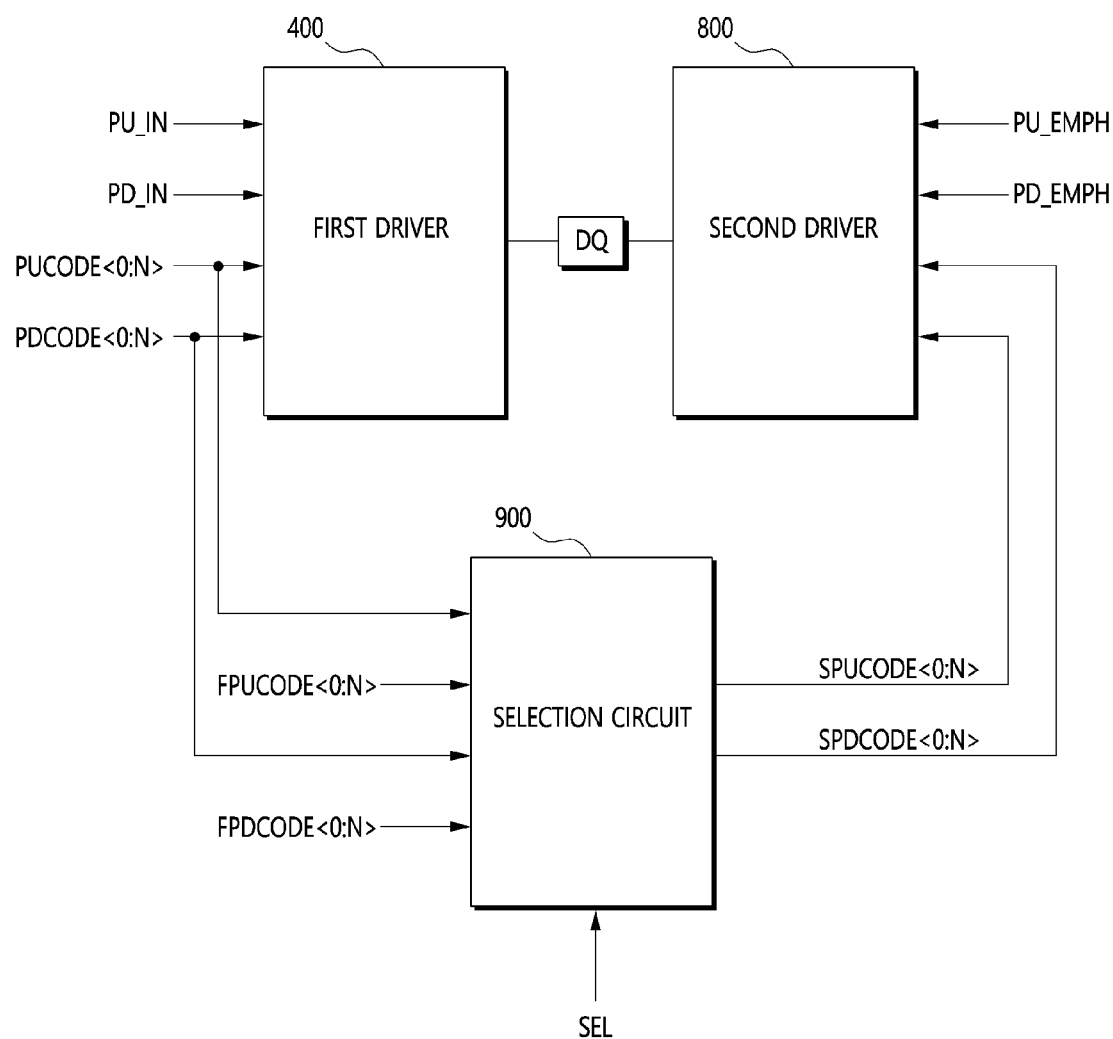

FIG. 6 is a diagram illustrating a configuration of a data output buffer 300-4 according to another embodiment.

The data drivability for the data I/O pad DQ in the data output buffer 300-4 may be controlled according to the first and second impedance calibration codes PUCODE<0:N> and PDCODE<0:N>.

The de-emphasis drivability for the data I/O pad DQ in the data output buffer 300-4 may be controlled according to all or at least one of the code bits of the first impedance calibration code PUCODE<0:N>, all or at least one of the code bits of the second impedance calibration code PDCODE<0:N>, all or at least one of code bits of a first fixing code FPUCODE<0:N>, and all or at least one of code bits of a second fixing code FPDCODE<0:N>.

Referring to FIG. 6, the data output buffer 300-4 according to another embodiment may include a first driver 400, a second driver 800, and a selection circuit 900.

The first driver 400 may drive the data I/O pad DQ according to the first data signal PU_IN, the second data signal PD_IN, the first impedance calibration code PUCODE<0:N>, and the second impedance calibration code PDCODE<0:N>.

The first driver 400 may drive the data I/O pad DQ according to the input signal, for example, the first data signal PU_IN and the second data signal PD_IN, and the data drivability may be controlled according to the first impedance calibration code PUCODE<0:N> and the second impedance calibration code PDCODE<0:N>.

The first driver 400 may have the same configuration as the first driver of FIG. 3.

The second driver 800 may perform the de-emphasis operation on an output terminal, for example, the data I/O pad DQ according to the emphasis signal PU_EMPH/PD_EMPH, all or at least one of code bits of a first selection code SPUCODE<0:N>, and all or at least one of code bits of a second selection code SPDCODE<0:N>.

As the at least one code bit of the first selection code SPUCODE<0:N> and the at least one code bit of the second selection code SPDCODE<0:N>, upper code bits, for example, the first selection code SPUCODE<m:N> and the second selection code SPDCODE<m:N> may be used.

The second driver 800 may perform the de-emphasis operation on the data I/O pad DQ and the de-emphasis drivability may be controlled according to the first and second selection codes SPUCODE<0:N> and SPDCODE<0:N>.

The second driver 800 may be designed to have the same configuration as the second driver 600 of FIG. 4 or may be designed to have the same configuration as the second driver 700 of FIG. 5.

When the second driver 800 is designed to have the same configuration as the second driver 600 of FIG. 4, all the code bits of the first and second selection codes SPUCODE<0:N> and SPDCODE<0:N> may be used.

When the second driver 800 is designed to have the same configuration as the second driver 700 of FIG. 5, the first and second selection code SPUCODE<m:N> and SPDCODE<m:N> may be used.

The selection circuit 900 may output one of the first impedance calibration code PUCODE<0:N> and the first fixing code FPUCODE<0:N> as the first selection code SPUCODE<0:N> and may output one of the second impedance calibration code PDCODE<0:N> and the second fixing code FPDCODE<0:N> as the second selection code SPDCODE<0:N>, according to a selection signal SEL.

The first and second fixing codes FPUCODE<0:N> and FPDCODE<0:N> may have the fixing values regardless of the operation of the impedance calibration circuit 100 of FIG. 1.

When the selection signal SEL is at a high level, the selection circuit 900 may output the first impedance calibration code PUCODE<0:N> as the first selection code SPUCODE<0:N> and may output the second impedance calibration codes PDCODE<0:N> as the second selection code SPDCODE<0:N>.

When the selection signal SEL is at a low level, the selection circuit 900 may output the first fixing code FPUCODE<0:N> as the first selection code SPUCODE<0:N> and may output the second fixing code FPDCODE<0:N> as the second selection code SPDCODE<0:N>.

The data output buffer 300-4, according to another embodiment, may divide the de-emphasis operation into a first emphasis mode and a second emphasis mode according to the selection signal SEL.

The first emphasis mode may be a mode in which the selection signal SEL is generated as the high level and the de-emphasis drivability is controlled according to the first and second impedance calibration codes PUCODE<0:N> and PDCODE<0:N> that are provided from the impedance calibration circuit 100.

The second emphasis mode may be a mode in which the selection signal SEL is generated as the low level and the de-emphasis drivability is controlled according to the first and second fixing codes FPUCODE<0:N> and FPDCODE<0:N>.

The data output buffer 300-4 may further include a pre-driver (not shown) that is configured to generate the first data signal PU_IN and the second data signal PD_IN according to the read data RDATA.

The data output buffer 300-4 may operate in the same manner as at least one of the operation of the data output buffer 300-2, described above with reference to FIG. 4, and the operation of the data output buffer 300-3, according to another embodiment described above with reference to FIG. 5.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A data output buffer comprising:
   a first driver configured to directly receive an impedance calibration code, drive a data input/output (I/O) pad according to an input signal and allow data drivability to be controlled according to the impedance calibration code;
   a second driver configured to directly receive emphasis signals, perform a de-emphasis operation on the data I/O pad and allow de-emphasis drivability to be controlled according to a selection code and the emphasis signals; and
   a selection circuit configured to output one of a fixing code and the impedance calibration code as the selection code according to a selection signal,
   wherein the first driver and the second driver are coupled to the data I/O pad directly.

2. The data output buffer of claim 1, wherein the first driver includes:
   a pull-up driver configured to drive the data I/O pad according to a first data signal of the input signal and allow the data drivability to be controlled according to a first impedance calibration code of the impedance calibration code; and
   a pull-down driver configured to drive the data I/O pad according to a second data signal of the input signal and allow the data drivability to be controlled according to a second impedance calibration code of the impedance calibration code.

3. The data output buffer of claim 1, wherein the second driver includes:
   a pull-up driver configured to perform the de-emphasis operation according to a first emphasis signal of the emphasis signals and allow the de-emphasis drivability to be controlled according to all code bits of a first selection code of the selection code; and
   a pull-down driver configured to perform the de-emphasis operation according to a second emphasis signal of the emphasis signals and allow the de-emphasis drivability to be controlled according to all code bits of a second selection code of the selection code.

4. The data output buffer of claim 1, wherein the second driver includes:
   a plurality of pull-up driving circuits configured to commonly receive a first emphasis signal the emphasis signals and receive all code bits of a first selection code of the selection code bit by bit, respectively; and
   a plurality of pull-down driving circuits configured to commonly receive a second emphasis signal of the emphasis signals and receive all code bits of a second selection code of the selection code bit by bit, respectively.

5. The data output buffer of claim 1, wherein the second driver includes:
   a pull-up driver configured to perform the de-emphasis operation according to a first emphasis signal of the emphasis signals and allow the de-emphasis drivability to be controlled according to partial code bits of a first selection code of the selection code; and
   a pull-down driver configured to perform the de-emphasis operation according to a second emphasis signal of the emphasis signals and allow the de-emphasis drivability to be controlled according to partial code bits of a second selection code of the selection code.

6. The data output buffer of claim 1, wherein the second driver includes:
   a plurality of pull-up driving circuits configured to commonly receive a first emphasis signal of the emphasis signals and receive partial code bits of a first selection code of the selection code bit by bit, respectively; and
   a plurality of pull-down driving circuits configured to commonly receive a second emphasis signal of the emphasis signals and receive partial code bits of a second selection code of the selection code bit by bit, respectively.

7. The data output buffer of claim 2, wherein the second driver includes:
   a pull-up driver configured to perform the de-emphasis operation by raising a voltage level of the data I/O pad when the pull-down driver of the first driver drives the data I/O pad as a low level; and
   a pull-down driver configured to perform the de-emphasis operation by lowering the voltage level of the data I/O pad when the pull-up driver of the first driver drives the data I/O pad as a high level.

8. A semiconductor apparatus comprising:
   a memory region configured to output read data through a data input/output (I/O) pad according to a read command and configured to store write data that is input through the data I/O pad according to a write command;
   an impedance calibration circuit configured to adjust a value of an impedance calibration code based on an impedance of an external resistor;
   a first driver configured to directly receive the impedance calibration code. drive the data input/output (I/O) pad according to an input signal and allow data drivability to be controlled according to the impedance calibration code;
   a second driver configured to directly receive emphasis signals, perform a de-emphasis operation on the data I/O pad and allow de-emphasis drivability to be controlled according to a selection code and the emphasis signals; and a selection circuit configured to output one of a fixing code and the impedance calibration code as the selection code according to a selection signal, wherein the first driver and the second driver are coupled to the data I/O pad directly.

9. The semiconductor apparatus of claim 8, wherein the first driver includes:

a pull-up driver configured to drive the data I/O pad according to a first data signal of the input signal and allow the data drivability to be controlled according to a first impedance calibration code of the impedance calibration code; and a pull-down driver configured to drive the data I/O pad according to a second data signal of the input signal and allow the data drivability to be controlled according to a second impedance calibration code of the impedance calibration code.

10. The semiconductor apparatus of claim 8, wherein the second driver includes:

a pull-up driver configured to perform the de-emphasis operation according to a first emphasis signal of the emphasis signals and allow the de-emphasis drivability to be controlled according to all code bits or partial code bits of a first selection code of the selection code; and a pull-down driver configured to perform the de-emphasis operation according to a second emphasis signal of the emphasis signals and allow the de-emphasis drivability to be controlled according to all code bits or partial code bits of a second selection code of the selection code.

11. The semiconductor apparatus of claim 8, wherein the second driver includes:

a plurality of pull-up driving circuits configured to commonly receive a first emphasis signal of the emphasis signals and receive all code bits or partial code bits of a first selection code of the selection code bit by bit, respectively; and a plurality of pull-down driving circuits configured to commonly receive a second emphasis signal of the emphasis signals and receive all code bits or partial code bits of a second selection code of the selection code bit by bit, respectively.

12. The semiconductor apparatus of claim 9, wherein the second driver includes:

a pull-up driver configured to perform the de-emphasis operation by raising a voltage level of the data I/O pad when the pull-down driver of the first driver drives the data I/O pad as a low level; and a pull-down driver configured to perform the de-emphasis operation by lowering the voltage level of the data I/O pad when the pull-up driver of the first driver drives the data I/O pad as a high level.

* * * * *